(12) United States Patent
Cooney et al.

(10) Patent No.: US 10,998,706 B2
(45) Date of Patent: May 4, 2021

(54) LAMINATED BUS BARS

(71) Applicant: Hamilton Sundstrand Corporation, Charlotte, NC (US)

(72) Inventors: Robert C. Cooney, Janesville, WI (US); Huazhen Chai, Caledonia, IL (US)

(73) Assignee: Hamilton Sundstrand Corporation, Charlotte, NC (US)

(*) Notice: Subject to any disclaimer, the term of this patent is extended or adjusted under 35 U.S.C. 154(b) by 0 days.

(21) Appl. No.: 16/596,036

(22) Filed: Oct. 8, 2019

(65) Prior Publication Data

US 2021/0104882 A1 Apr. 8, 2021

(51) Int. Cl.
*H02G 5/00* (2006.01)
*H05K 1/02* (2006.01)
*H02M 7/00* (2006.01)

(52) U.S. Cl.
CPC ............ *H02G 5/005* (2013.01); *H02M 7/003* (2013.01); *H05K 1/0265* (2013.01)

(58) Field of Classification Search
CPC ...... H02G 5/005; H02M 7/003; H05K 1/0265
USPC ...................................................... 174/72 B
See application file for complete search history.

(56) References Cited

U.S. PATENT DOCUMENTS

| | | | | |
|---|---|---|---|---|
| 3,778,735 A * | 12/1973 | Steenmetser | .......... | H02G 5/005 333/238 |
| 4,236,038 A * | 11/1980 | Taylor | .................. | H01B 7/0018 174/72 B |
| 4,436,953 A * | 3/1984 | Gottlieb | ................. | H02G 5/005 174/72 B |
| 4,440,972 A | 4/1984 | Taylor | | |
| 4,451,694 A | 5/1984 | Harper et al. | | |
| 4,584,768 A * | 4/1986 | Tosti | ...................... | H02G 5/005 29/872 |
| 4,908,258 A * | 3/1990 | Hernandez | ............... | H01G 4/20 174/254 |
| 5,051,542 A * | 9/1991 | Hernandez | ............. | H05K 1/162 174/72 B |
| 6,218,622 B1 * | 4/2001 | Rimmer | ................. | H02G 5/005 174/117 FF |
| 6,452,776 B1 * | 9/2002 | Chakravorty | ..... | H01L 21/76894 257/520 |
| 6,870,134 B2 * | 3/2005 | Sol | .................... | B32B 17/10036 219/203 |
| 7,557,298 B2 * | 7/2009 | Vanhoutte | .............. | H02G 5/005 174/149 B |

(Continued)

FOREIGN PATENT DOCUMENTS

WO 13/179433 A1 12/2013

OTHER PUBLICATIONS

Extended European Search Report dated Jun. 24, 2020, issued during the prosecution of European Patent Application No. EP 19215924.2.

*Primary Examiner* — Timothy J Thompson
*Assistant Examiner* — Michael F McAllister
(74) *Attorney, Agent, or Firm* — Locke Lord LLP; Joshua L. Jones; Scott D. Wofsy

(57) ABSTRACT

A system includes a first bus bar. A foil element is spaced apart from the first bus bar. The foil element is electrically connected to the first bus bar by grid elements. A second bus bar is spaced apart from the foil element across a dielectric layer. The system can include a second foil element spaced apart from the second bus bar.

20 Claims, 2 Drawing Sheets

(56) References Cited

U.S. PATENT DOCUMENTS

| | | |
|---|---|---|
| 9,137,888 B2* | 9/2015 | Kusukawa ............ H05K 1/0265 |
| 9,979,173 B2* | 5/2018 | Benavides ............. H02G 5/005 |
| 10,021,802 B2* | 7/2018 | Schuetz ................ H02B 1/205 |
| 2018/0048127 A1* | 2/2018 | Liang ..................... H02G 5/00 |
| 2019/0191550 A1* | 6/2019 | Sasao ................ H03K 17/6874 |

* cited by examiner

LAMINATED BUS BARS

BACKGROUND

1. Field

The present disclosure relates to electrical systems, and more particularly to laminated bus bars.

2. Description of Related Art

Bus bars carry high voltages. If a fault occurs between two live bus bars, e.g. due to a defect in the insulation separating the two bus bars, the high energy levels can potentially lead to cascading faults. The same can happen if there is a fault between a live bus bar and ground.

The conventional techniques have been considered satisfactory for their intended purpose. However, there is an ever present need for improved systems and methods for bus bars and fault clearing in bus bars. This disclosure provides a solution for this need.

SUMMARY

A system includes a first bus bar. A foil element is spaced apart from the first bus bar. The foil element is electrically connected to the first bus bar by grid elements. A second bus bar is spaced apart from the foil element across a dielectric layer.

The foil element can be a first foil element, wherein the grid elements are a first set of grid elements, and the system can include a second foil element spaced apart from the second bus bar. The second foil element can be electrically connected to the second bus bar by a second set of grid elements. The second foil element can be spaced apart from the first foil element by the dielectric layer. The first set of grid elements can pass through a first dielectric sub-layer that otherwise separates the first bus bar from the first foil element. The second set of grid elements can pass through a second dielectric sub-layer that otherwise separates the second bus bar from the second foil element. The first bus bar, the first foil element, and the first set of grid elements can be coated with a first plating. The second bus bar, the second foil element, and the second set of grid elements can be coated with a second plating.

The first bus bar can have a thickness that is more than twice that of the first foil element. The second bus bar can have a thickness that is more than twice that of the second foil element. The first dielectric sub-layer can be thicker than the first foil element. The second dielectric sub-layer can be thicker than the second foil element. The dielectric layer can be thinner than the first bus bar, wherein the dielectric layer is thinner than the second bus bar. An external dielectric coating around the first and second bus bars can coat laterally along lateral edges of the first and second bus bars, the first and second foil elements, the first and second dielectric sub-layers, and the dielectric layer.

A direct current source can be connected to the first bus bar with a positive potential, and connected to the second bus bar with a negative potential. A load can be electrically connected across the first and second bus bars, wherein the load is electrically connected through the first and second bus bars to the direct current source.

A method includes powering a load through a laminated bus bar assembly. The method includes clearing a fault in the laminated bus bar assembly by locally breaking a fusible link within the laminated bus bar assembly, and continuing to power the load through the laminated bus bar assembly after the fault is cleared.

Locally breaking a fusible link can include breaking a fusible link between a foil element and a bus bar at a grid element electrically connecting the node to the bar. The fusible link can include a section of the foil element between two grid elements electrically connecting the bus bar to the foil element. Continuing to power the load can include utilizing additional fusible links within the laminated bus bar assembly to protect against future faults. The bus bar can carry a load, wherein the foil element carries only a transient current, wherein the load has a lower frequency than the transient current.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
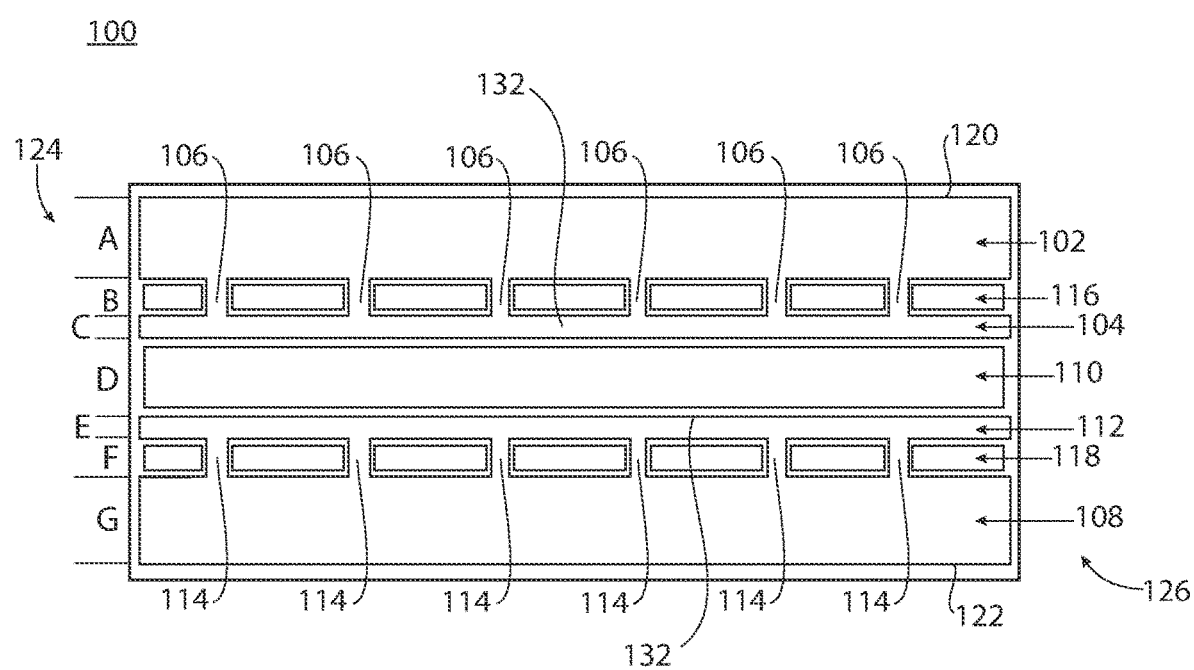
FIG. 1 is a schematic side elevation view of an embodiment of a system constructed in accordance with the present disclosure, showing the laminated bus bar assembly.

Reference will now be made to the drawings wherein like reference numerals identify similar structural features or aspects of the subject disclosure. For purposes of explanation and illustration, and not limitation, a partial view of an embodiment of a system in accordance with the disclosure is shown in FIG. 1 and is designated generally by reference character 100. Other embodiments of systems in accordance with the disclosure, or aspects thereof, are provided in FIG. 2, as will be described. The systems and methods described herein can be used to provide self-clearing of faults in laminated bus bars.

The system 100 includes a first bus bar 102. A foil element 104 is spaced apart from the first bus bar 102. The foil element 104 is electrically connected to the first bus bar 102 by grid elements 106. A second bus bar 108 is spaced apart from the foil element 104 across a dielectric layer 110. A second foil element 112 is spaced apart from the second bus bar 108. The second foil element 112 is electrically connected to the second bus bar 108 by a second set of grid elements 114. The second foil element 112 is spaced apart from the first foil element 104 by the dielectric layer 110.

With continued reference to FIG. 1, the first set of grid elements 106 pass through a first dielectric sub-layer 116 that otherwise separates the first bus bar 102 from the first foil element 104. The second set of grid elements 114 pass through a second dielectric sub-layer 118 that otherwise separates the second bus bar 108 from the second foil element 112. The dielectric layer 110 and the first and second dielectric sub-layers 116 and 118 can each include a dielectric adhesive material for adhering the laminate assembly of the system 100 together.

With continued reference to FIG. 1, the first bus bar 102, the first foil element 104, and the first set of grid elements 106 can be coated with a first plating 120. The second bus bar 108, the second foil element 112, and the second set of grid elements 114 may be coated with a second plating 122 that is separate from the first plating 120. An external dielectric coats the laminated assembly of the system 100, including coating around the first and second bus bars 102, 108, e.g., coating the upward facing surface of the bus bar 102 and the downward facing surface of the second bus bar 108 as oriented in FIG. 1, as well as coating laterally along lateral edges 124, 126 of the first and second bus bars 102,108, the first and second foil elements 104, 112, the first and second dielectric sub-layers 116, 118, and the dielectric layer 110.

The first bus bar 102 can have a thickness A that is more than twice the thickness C of the first foil element 104. The second bus bar 108 can have a thickness G that is more than twice the thickness E of the second foil element 112. The first dielectric sub-layer 116 can have a thickness B that is thicker than the thickness C of the first foil element 104. The second dielectric sub-layer 118 can have thickness F that is thicker than the thickness E of the second foil element 112. The dielectric layer 110 can have a thickness D that is thinner than the thickness A of the first bus bar and thinner than the thickness G of the second bus bar 108.

Figure 2:
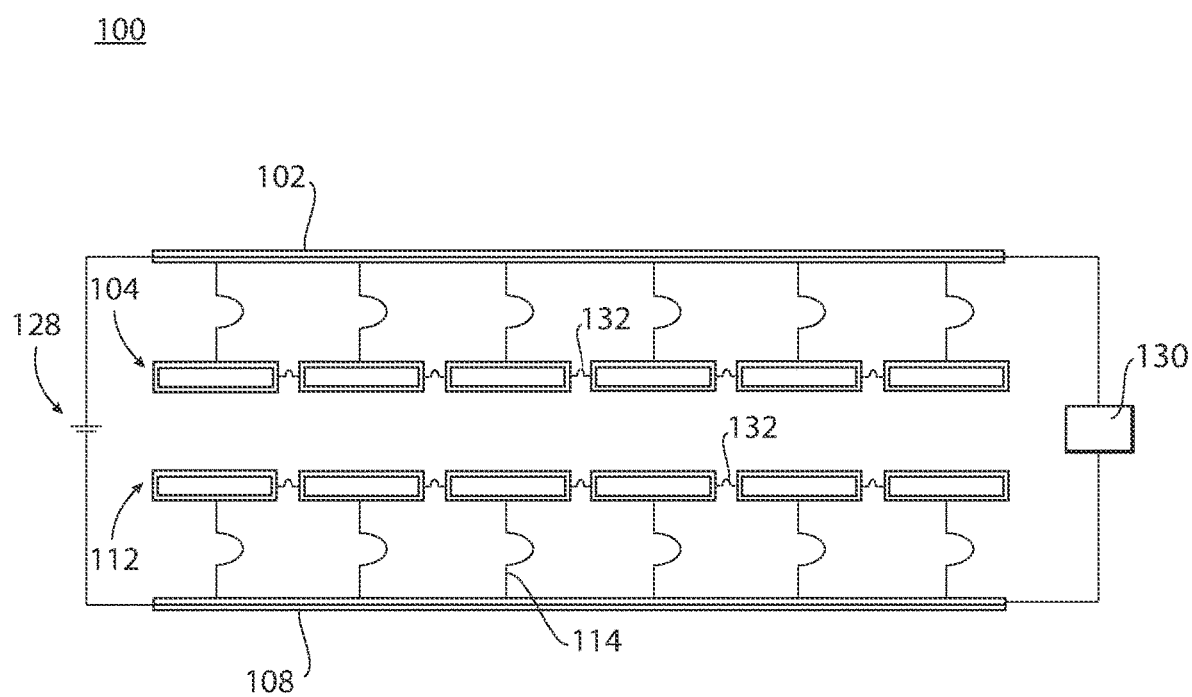
FIG. 2 is a schematic side elevation view of the system of FIG. 1, showing the fusible links for self-clearing faults.

With reference now to FIG. 2, a direct current source 128 can be connected to the first bus bar 102 with a positive potential, and connected to the second bus bar 108 with a negative potential. Those skilled in the art will readily appreciate that an AC current source could be used in lieu of direct current source 128 without departing from the scope of this disclosure. A load 130 can be electrically connected across the first and second bus bars 102, 108, wherein the load is electrically connected through the first and second bus bars 102, 108 to the direct current source 128.

With continued reference to FIG. 2, a method includes powering a load 130 through a laminated bus bar assembly, e.g., system 100. The method includes clearing a fault in the laminated bus bar assembly by locally breaking a fusible link within the laminated bus bar assembly, and continuing to power the load 130 through the laminated bus bar assembly after the fault is cleared. Locally breaking a fusible link can include breaking a fusible link between a foil element (e.g. foil elements 104, 112) and a bus bar (e.g. bus bars 102, 108) at a grid element (e.g. grid elements 106, 114) electrically connecting the node to the bar. It is also contemplated that the fusible link can include a section of the foil element between two of the grid elements (e.g. section 132 of the foil elements 104, 112, not all of which are labeled in FIGS. 1 and 2 for sake of clarity) electrically connecting the bus bar to the foil element. Continuing to power the load can include utilizing additional fusible links (e.g. grid elements 106, 114 and/or sections 132 of the foil elements 104, 112) within the laminated bus bar assembly to protect against future faults. The bus bar can carry low frequency load, wherein the foil element carries only a high frequency transient currents, wherein high and low frequency are relative to one another. The systems and method disclosed herein allow for laminate bus bars to self-clear faults and continue operation without cascading failures to surrounding components. Such a laminated bus bar can repeatedly clear its own faults without having to replace a line-replaceable unit (LRU) comprising the laminated bus bar.

The methods and systems of the present disclosure, as described above and shown in the drawings, provide for laminated bus bars with self-clearing of faults. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A system comprising:
    a first bus bar;
    a foil element spaced apart from the first bus bar, wherein the foil element is electrically connected to the first bus bar by grid elements; and
    a second bus bar spaced apart from the foil element across a dielectric layer.

2. The system as recited in claim 1, wherein the foil element is a first foil element, wherein the grid elements are a first set of grid elements, and further comprising a second foil element spaced apart from the second bus bar, wherein the second foil element is electrically connected to the second bus bar by a second set of grid elements.

3. The system as recited in claim 2, wherein the second foil element is spaced apart from the first foil element by the dielectric layer.

4. The system as recited in claim 2, wherein the first set of grid elements pass through a first dielectric sub-layer that otherwise separates the first bus bar from the first foil element.

5. The system as recited in claim 4, wherein the second set of grid elements pass through a second dielectric sub-layer that otherwise separates the second bus bar from the second foil element.

6. The system as recited in claim 5, wherein the first bus bar, the first foil element, and the first set of grid elements are coated with a first plating.

7. The system as recited in claim 6, wherein the second bus bar, the second foil element, and the second set of grid elements are coated with a second plating.

8. The system as recited in claim 5, wherein the first bus bar has a thickness that is more than twice that of the first foil element.

9. The system as recited in claim 8, wherein the second bus bar has a thickness that is more than twice that of the second foil element.

10. The system as recited in claim 5, wherein the first dielectric sub-layer is thicker than the first foil element.

11. The system as recited in claim 10, wherein the second dielectric sub-layer is thicker than the second foil element.

12. The system as recited in claim 5, wherein the dielectric layer is thinner than the first bus bar, and wherein the dielectric layer is thinner than the second bus bar.

13. The system as recited in claim 5, further comprising an external dielectric coating around the first and second bus bars that coats laterally along lateral edges of the first and second bus bars, the first and second foil elements, the first and second dielectric sub-layers, and the dielectric layer.

14. The system as recited in claim 5, further comprising a direct current source connected to the first bus bar with a positive potential, and connected to the second bus bar with a negative potential.

15. The system as recited in claim 14, further comprising a load electrically connected across the first and second bus bars, wherein the load is electrically connected through the first and second bus bars to the direct current source.

16. A method comprising:
    powering a load through a laminated bus bar assembly;
    clearing a fault in the laminated bus bar assembly by locally breaking a fusible link within the laminated bus bar assembly; and
    continuing to power the load through the laminated bus bar assembly after the fault is cleared.

17. The method as recited in claim 16, wherein locally breaking a fusible link includes breaking a fusible link between a foil element and a bus bar at a grid element electrically connecting the node to the bus bar.

18. The method as recited in claim 17, wherein the fusible link includes a section of the foil element between two grid elements electrically connecting the bus bar to the foil element.

19. The method as recited in claim 17, wherein continuing to power the load includes utilizing additional fusible links within the laminated bus bar assembly to protect against future faults.

20. The method as recited in claim 17, wherein the bus bar carries a load, and wherein the foil element carries only a transient current, wherein the load has a lower frequency than the transient current.

\* \* \* \* \*